United States Patent [19]

Ramalingam et al.

[11] Patent Number: 4,673,477
[45] Date of Patent: Jun. 16, 1987

[54] CONTROLLED VACUUM ARC MATERIAL DEPOSITION, METHOD AND APPARATUS

[75] Inventors: Subbiah Ramalingam, Roseville, Minn.; Cai B. Qi, Beijing, China; Kyunghoon Kim, St. Paul, Minn.

[73] Assignee: Regents of the University of Minnesota, Minneapolis, Minn.

[21] Appl. No.: 825,958

[22] Filed: Feb. 4, 1986

Related U.S. Application Data

[63] Continuation of Ser. No. 585,845, Mar. 2, 1984, abandoned.

[51] Int. Cl.$^4$ .............................................. C23C 14/22
[52] U.S. Cl. ............................... 204/192.38; 118/50.1; 118/723; 204/298; 427/37; 427/47
[58] Field of Search ............. 204/192 R, 298, 192.38; 118/50.1, 723, 728; 427/37, 47

[56] References Cited

U.S. PATENT DOCUMENTS

| | | | |
|---|---|---|---|
| 3,625,848 | 12/1971 | Snapper | 204/192 |
| 3,956,093 | 5/1976 | McLeod | 204/192 |
| 4,444,643 | 4/1984 | Garrett | 204/298 |
| 4,448,799 | 5/1984 | Bergman et al. | 427/37 |

FOREIGN PATENT DOCUMENTS

| | | | |
|---|---|---|---|
| 307666 | 1/1979 | U.S.S.R. | 427/37 |
| 363375 | 1/1979 | U.S.S.R. | 427/37 |

OTHER PUBLICATIONS

D. Hadfield, Permanent Magnets and Magnetism, Iliffe Books Ltd., London, 1962, pp. 213-214.

*Primary Examiner*—John F. Niebling
*Assistant Examiner*—William T. Leader
*Attorney, Agent, or Firm*—Kinney & Lange

[57] ABSTRACT

A method and apparatus for vacuum arc deposition of material on a surface of an object uses a vacuum chamber accommodating the active surface of the cathode and an anode. A power supply connected to the anode and cathode establishes an electric arc. The track of the arc is controlled with a magnetic field established with a permanent magnet that is moved in a closed path relative to the cathode. A solenoid modifies the main magnetic field produced on the active surface of the cathode.

25 Claims, 12 Drawing Figures

CONTROLLED VACUUM ARC MATERIAL DEPOSITION, METHOD AND APPARATUS

CROSS REFERENCE TO RELATED APPLICATION

This application is a continuation of my co-pending U.S. patent application Ser. No. 06/585,845, filed Mar. 2, 1984 for a Controlled Vacuum Arc Material Deposition, Method and Apparatus, now abandoned.

FIELD OF THE INVENTION

This invention relates to processes and apparatus for applying coatings by the deposition of material evaporated by an electric arc in a vacuum.

BACKGROUND OF THE INVENTION

Vacuum arc processes have been used in the preparation of pure high melting point metals. A by-product of this process is a thin metal film on the walls of the vacuum chamber. Lucas et al in the publication "A New Deposition Technique for Refractory Metal Films", American Vacuum Society Transactions 2, 1962, p. 988-991, describe a vacuum arc deposition technique to produce refractory metal films, such as noibium, tantalum, vanadium and iron films. This technique used an electric motor or hand lever to mechanically ignite the vacuum arc. The current flowing between an anode and a cathode electrode was interrupted by rapidly withdrawing the movable electrode a short distance from the stationary electrode. The short arc produced between the electrodes yields a vapor flux. This vapor flux condensed on a substrate to produce a metal film.

An electric arc ignited between a cathode and an anode in a vacuum generates cathode spots. Currents of a few amperes to a few hundred amperes yield intense cathode spots and diffuse anode spots. Typically, arcs are sustained in vacuum at anode-cathode potential differences of 10 to 25 volts or more. Arc sustaining voltage is a function of material properties. Substantial power is dissipated in an arc column. For an arc current of 100 amperes and a voltage of 20 volts, power dissipation is 2 KW. In such an arc column, more than half of the arc power is dissipated at the cathode. A large part of the remainder is dissipated at the anode.

Intense cathode spots produced are very small in size. Current density at the cathode spot is of the order of $10^5$ to $10^7$ amperes per square cm. The arc duration at a cathode spot usually varies between a few to several thousand microseconds. High local temperatures are produced due to high current densities. Cathode spot temperatures approximately equal the boiling point of the material making up the cathode. Due to this high temperature, substantial vapor pressures are developed by vacuum arcs. The vapors produced by cathode spots are used to coat objects placed within the vacuum chamber and to sustain the arc ignited between the cathode and an anode.

Snaper in U.S. Pat. No. 3,625,848 discloses an apparatus for coating an object with a thin film of source material with the use of a vacuum arc. A beam of source atoms and ions is directed at a base or substrate to be coated within a vacuum chamber. The beam gun has a cathode and an anode arranged to sustain an arc discharge. Current flow between the cathode and an igniter electrode attached to a permanent magnet is interrupted to ignite the arc. This is accomplished by passing the current through a solenoidal coil located outside the vacuum chamber. The solenoidal coil field interacts with the permanent magnet connected to the igniter electrode to interrupt current flow in the cathode igniter circuit. This current flow interruption produces a short arc which is sustained between the main anode and cathode. The magnetic field of the solenoid also modifies the operating characteristics of the gun and increases the arc potential between the cathode and anode.

Sablev et al in U.S. Pat. No. 3,793,179 disclose an apparatus for metal evaporation coating. The apparatus embodies a mechanical arc igniter between a disk cathode and a hollow spherical anode. A solenoid armature and an igniter circuit is incorporated in the main arc circuit in such a manner as to automatically re-ignite the arc whenever it extinguishes. The arc once produced is free to move at random at high speed over the cathode surface. Arc spot motion is chaotic and uncontrolled. Periodically, arc spots will pass the edge of the cathode. This extinguishes the arc.

Rapidly moving, short-lived arc spots darting across the cathode surface generate vapor as well as discrete metal particles. Solid metal particles deposited on objects degrade their surface finish and the quality of the coated film. In many applications, such as thin film devices, recording media, optical coatings and tribological coatings, the presence of micron-size solid particles is unacceptable.

SUMMARY OF THE INVENTION

The present invention is a method and apparatus for applying material by vacuum arc deposition onto the surface of an object or part located in a vacuum chamber. A power supply electrically coupled to the anode and cathode is operable to sustain an electric arc between the active survace of the cathode and the anode. Means are provided to control and direct the path of the arc produced on the active surface of the cathode. The arc is made to travel repeatedly over the same track to provide for vapor production of the material. Production of discrete particles of the material is eliminated in material having higher melting temperature and greatly reduced in other materials. The arc being directed to travel along a pre-selected track is not free to wander off the cathode active surface. This obviates the need for automatic re-ignition. The control over the arc track is obtained by generating a magnetic field with field vectors either completely or substantially parallel to the active surface of the cathode. The arc column is generally perpendicular to the active surface of the cathode and the applied magnetic field is parallel to the active surface of the cathode which generates a Hall force that acts on the ions as well as the electrons in the vicinity of the cathode. The Hall force leads to cycloidal motion of electrons and massive ions move in the opposite direction. As they move under the influence of the applied magnetic field, the ions are also subject to the prevailing electric field. They are attracted to the active surface of the cathode. Sufficient number of ions impinging on the active surface of the cathode in the vicinity of the original cathode spot at a location consistent with the prevailing electric and magnetic fields induce intense local heating and electron emission in order to render this spot the new cathode spot. The presence of a local magnetic field appropriately disposed at this location can in turn lead to the generation of the next new cathode spot. The chaotic sequence of arc spots on the cathode surface of the prior arc deposition devices is replaced with an orderly sequence where all permitted cathode spots lie on a preselected track. This enables control over arc motion on the active surface of the cathode and eliminates periodic arc quenching due to chaotic arc motion beyond the cathode edge.

In one embodiment of the invention, the apparatus has a housing means defining a vacuum chamber accommodating the anode. A head mounted on the housing means supports the cathode. The cathode has an active surface located in the vacuum chamber spaced from the anode. Two power supplies coupled to the anode and cathode generate and sustain an electric arc between the active surface of the cathode and the anode. Magnet means, such as a permanent magnet, located adjacent the cathode establishes a magnetic field to control and direct the path of movement of the arc along a defined closed track such as a circle produced on the active surface of the cathode. The magnet means is movably mounted on the head for controlled movement. The movement of the magnet means causes the arc track defined by the magnet means to sweep the active surface of the cathode. The magnetic field of a solenoidal coil or Helmholtz coil system is superpositioned on the magnetic field of the magnet means to modify the magnetic field produced on the active surface of the cathode by the magnet means. The direction of the current through the coil is chosen to either reinforce or reduce the magnetic field strength normal to the active surface of the cathode. The solenoidal coil or Helmholtz coil system provudes additional control over the arc path defined by the magnet means on the active surface of the cathode. This enables the generation of a magnetic field on the active surface of the cathode with a field more closely parallel to the active surface of the cathode than the field obtained solely with the magnet means.

The head is provided with a cooling chamber accommodating the magnetic means. The magnetic means is supported in the cooling chamber adjacent the cathode and moves or sweeps relative to the cathode according to predetermined movements such as circular, rectangular, oscillatory, or combinations of these movements whereby the arc is moved in a continuous controlled arc track. A cooling fluid, such as water, is continuously moved through the cooling chamber to provide an efficient and controlled cooling of the cathode.

The invention embodies a method of vacuum arc deposition of material on the surface of an object or part. A vacuum is established in a chamber accommodating an anode and the active surface of the cathode. Electrical potential from two power supplies is supplied to the anode and the cathode to ignite and maintain an electric arc between the anode and the cathode. The track of the arc is defined by a magnetic field established with magnet means relative to the active surface of the cathode. The magnet means is moved relative to the cathode to sweep the active surface of the cathode with the arc track defined by the magnet means. The magnetic field can be modified with a solenoid generated magnetic field to selectively reinforce or reduce the magnetic field strength normal to the active surface of the cathode. The solenoid can be controlled to generate a desired magnetic field that controls the movement of the arc in a continuous arc track.

The method and apparatus for vacuum arc deposition of material is used to metallize semi-conductors and fabricate integrated circuits. Other utilizations include the deposition of recording media, optical coatings, optical storage media, protective coatings, and tool coatings. The coating materials can be metals, ceramics, carbon, silicon, and the like. Coatings can also be applied to polymer films. The films can be continuously moved to apply a continuous coating on the surface of the films. The fabrication of modulated micro structures, including metal-matrix composites can be accomplished.

DESCRIPTION OF THE PREFERRED EMBODIMENTS

Figure 1:
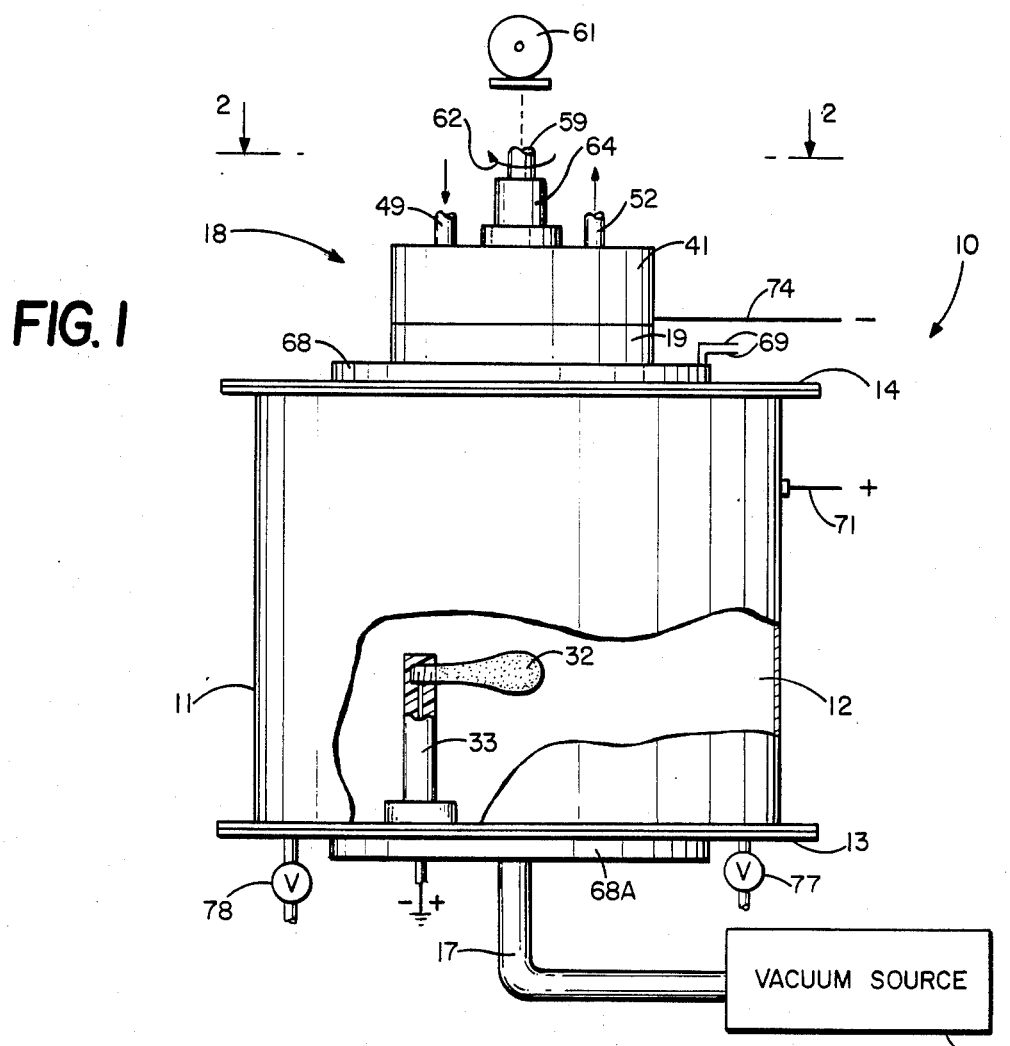
FIG. 1 is an elevational view, partly sectioned, of the controlled vacuum arc material deposition apparatus of the invention.
Figure 2:
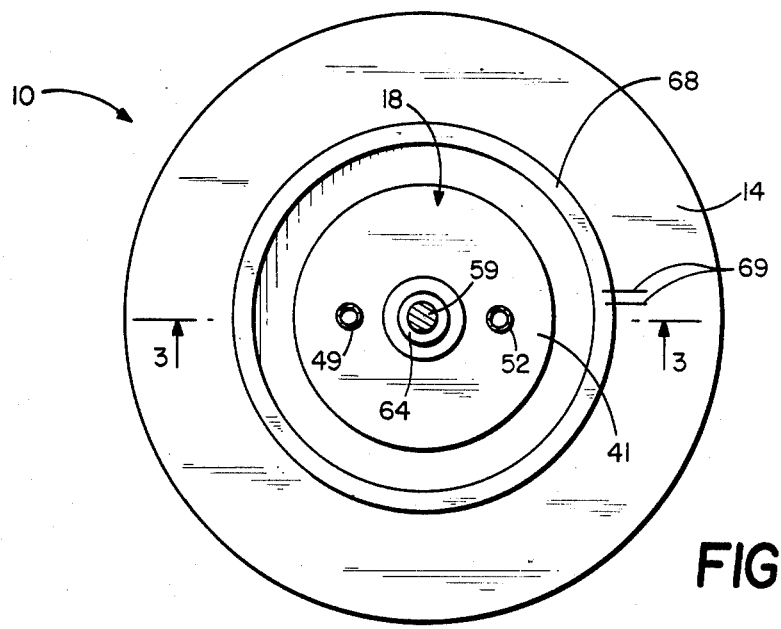
FIG. 2 is a sectional view taken along the line 2—2 of FIG. 1.

Referring to FIG. 1, there is shown the controlled vacuum arc material deposition apparatus 10 of the invention. The apparatus 10 has a housing 11 enclosing a vacuum chamber 12. Housing 11 includes a generally flat bottom wall 13 and a flat top wall 14. A vacuum source 16 coupled to bottom wall 13 with a tubular member or hose 17 is operable to maintain a vacuum in chamber 12. Chamber 12 is evacuated to pressures from below $10^{-6}$ to $10^{-1}$ mm of Hg.

Figure 3:
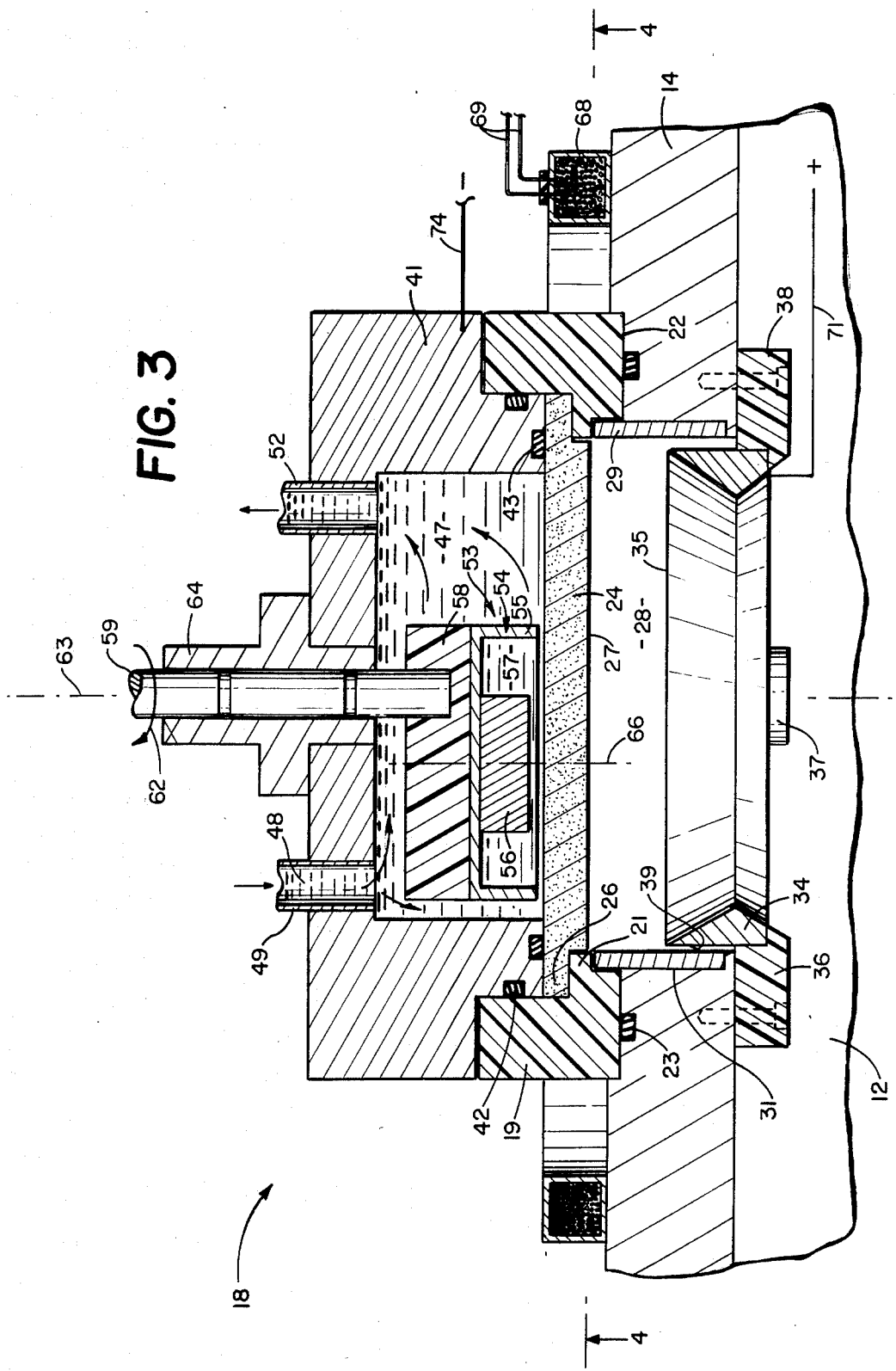
FIG. 3 is an enlarged sectional view taken along the line 3—3 of FIG. 2 showing the material deposition head.

A material deposition head indicated generally at 18 is mounted on top wall 14. Head 18 can be mounted on the side wall of the housing. The head can be located entirely within the vacuum chamber 12. Referring to FIG. 3, head 18 has an annular body 19 provided with an inwardly directed annular shoulder 21. The body 19 is an electrical insulation ring seated in a circular recess 22 in top wall 14. An O-ring 23 located in a groove in top wall 14 maintains a sealing relationship between body 19 and top wall 14. A disk cathode or target 24 has an outwardly directed annular lip 26 located on shoulder 21. The catode 24 is metal, alloy, carbon or other material that coats an object 32, such as a turbine blade. An electrical insulator support 33 attached to bottom wall 13 locates object in vacuum chamber 12. Other types of supports can be used to hold the object in vacuum chamber. Other types of objects, parts, films, and the like, can be coated with the material of cathode 24 in vacuum chamber 12. The inside or active surface 27 of cathode 24 extends over a circular opening 28 in top wall 14. Active surface 27 is in vacuum chamber 12. A metal sleeve 29 is located in an annular recess 31 in wall 14 surrounding opening 28. The upper edge of sleeve 29 engages shoulder 21 with a gap between sleeve 29 and body 19. Metal sleeve 29 shields the insulation body 19 to prevent an electrical short between the cathode-anode by the deposition of coating flux on the inner cylindrical surface of body 19.

A ring or annular anode 34 extended into opening 28 is mounted on top wall 14 with a plurality of electrical insulation blocks 36, 37 and 38. Other means can be used to support anode 34 on housing 11. The anode may be alternately placed generally within the vacuum chamber 12, below top wall 14 and parallel to the bottom surface of top wall 14. Anode 34 has a circular shape edge 35 facing cathode 24 and an outer cylindrical surface 39 spaced inwardly from annular metal sleeve 29. Edge 35 is formed by the acute angle shape in cross section of anode 34. The sharp edge 35 results in less coating on anode 34. The cross sectional shape of the ring anode is generally triangular. The lower side of the triangle is truncated. The lower part of anode 34 tapers downwardly and outwardly to minimize interference with the passage of flux through the center opening of anode 34. Sharp edge 35 and annular or ring shape of anode 34 also aids in arc ignition at relatively low voltage.

A cathode carrier 41, made of conducting material, telescopes into body 19 and retains disk cathode 24 on shoulder 21. Carrier 41 accommodates a first seal or O-ring 42 engageable with body 19 and a second seal or O-ring 43 engageable with the top of disk cathode 24. Carrier 41 has an internal chamber 47 accommodating a cooling liquid 48, such as water. A liquid supply line 49 carries liquid from a supply source 51, shown in FIG. 5, such as a pump, to chamber 47. A liquid return line 52 connected to carrier 41 carries the liquid back to liquid source 51. The liquid is continuously moving through chamber 47 to cool disk cathode 24.

A magnet apparatus indicated generally at 53 is located in chamber 47. Magnet apparatus 53 is operable to generate a magnetic field with field vectors substantially parallel to the active surface 27 of cathode 24. Magnet apparatus has an inverted cup-shape member or pole 54 having an open end facing disk cathode 24. Member 54 is a soft magnetic structure having a cylindrical flange 55 located in close relation to the upper or outside surface of cathode 24. A cylindrical disk magnet member or pole 56 is attached to the top of member 54. The outer surface of magnet member 56 is spaced from the annular sidewall of the cup-shaped member 54 by an annular gap or space 57. The cup-shaped member 54 is attached to an electrical insulator or mounting plate 58. A rotatable shaft 59 projects into chamber 47 and is secured to mounting plate 58. Shaft 59 rotatably supports mounting plate 58 and magnet apparatus 53 in the chamber 47 and locates the magnet apparatus in contiguous relationship relative to disk cathode 24. A variable speed electric motor 61, shown in FIG. 5, drivably connected to shaft 59 is operable to rotate the shaft as indicated by arrow 62 about the shaft axis 63. Shaft 59 is mounted in a sleeve bearing assembly 64 attached to top member 41. Magnet apparatus 53 has a magnetic axis 66 offset from shaft axis 63 whereby on rotation of shaft 59 by motor 61 the magnet apparatus 53 is moved in a continuous circular path. The circular path is illustrated at 67 in FIG. 4. The axis 66 is the symmetrical axis of magnet apparatus 53. Axis 66 is parallel to and offset from rotational axis 63. This arrangement enables the sweeping of the arc track 60 defined by magnet means so that the arc sweeps the area between an inner circle 65 and an outer circle 70 of the active surface 27 of cathode 24. The active surface 27 of the cathode 24 is the coating flux producing surface. Magnet apparatus can be a rectangular bar permanent magnet rotated about central axis 63 to cause the arc to sweep the active surface of the cathode 24 in a continuous predetermined rectangular path. Other shapes of the magnet apparatus and appropriate choices of rotational axes can be used to define arc tracks and to cause these arc tracks to sweep the active surface 27 of the cathode 24. Electric coil magnet structure can be used in lieu of the permanent magnet apparatus to establish the desired magnetic field to control the arc path.

Bearing assembly 64 seals water cooling chamber 47 without inhibiting the rotary motion of shaft 59. Water enters cooling chamber 47 via line 49 and exits chamber 47 via line 52. Adjusting the rate of flow of the water through chamber 47 produces an efficient and controlled cooling of the rear surface of cathode 24. The rotation of the magnet apparatus 53 circulates the liquid in chamber 47 and aids the cooling of cathode 24.

An electrical coil or winding 68 is mounted on top wall 14 concentric with shaft axis 63. Coil 68 surrounds head 18 and is located generally in the plane of cathode 27. Coil 68 is a solenoidal coil operable to cancel out or greately reduce the vertical magnetic field component of magnet apparatus 53, and generate a purely parallel magnetic field on the active surface of the cathode 24. The superposition of the coil field on the magnet field of magnet apparatus 53 results in tighter control over the arc track 60. Lines 69 connect coil 68 to a control 75, shown in FIG. 5, and a source of electric power. Control 75 can be a manual current control device or computer controller that can be programmed to regulate the power to coil 68. A current passing through coil 68 modifies the main magnetic field produced on the active surface 27 of cathode 24 by magnet apparatus 53. The direction of the current through coil 68 is chosen to reinforce or reduce the magnetic field strength normal to the cathode active surface 27 of cathode 24. The magnetic field of magnet apparatus 53 has a component normal to the cathode active surface 27. This field component can be cancelled out or greatly reduced or can be increased by the superposition of a magnetic field generated by solenoid 68. This results in a tighter control over the arc track.

A second coil 68A is mounted on bottom wall 13 in axial alignment with coil 68. Lines 69A connect coil 68A to control 75 or control 75A and a power supply. Coils 68 and 68A may be concurrently used as a Helmholtz coil system to modify the magnetic field produced on the active surface of the cathode 24. This is an alternate means of controlling the magnetic field on the active surface 27 of cathode 24.

Figure 5:
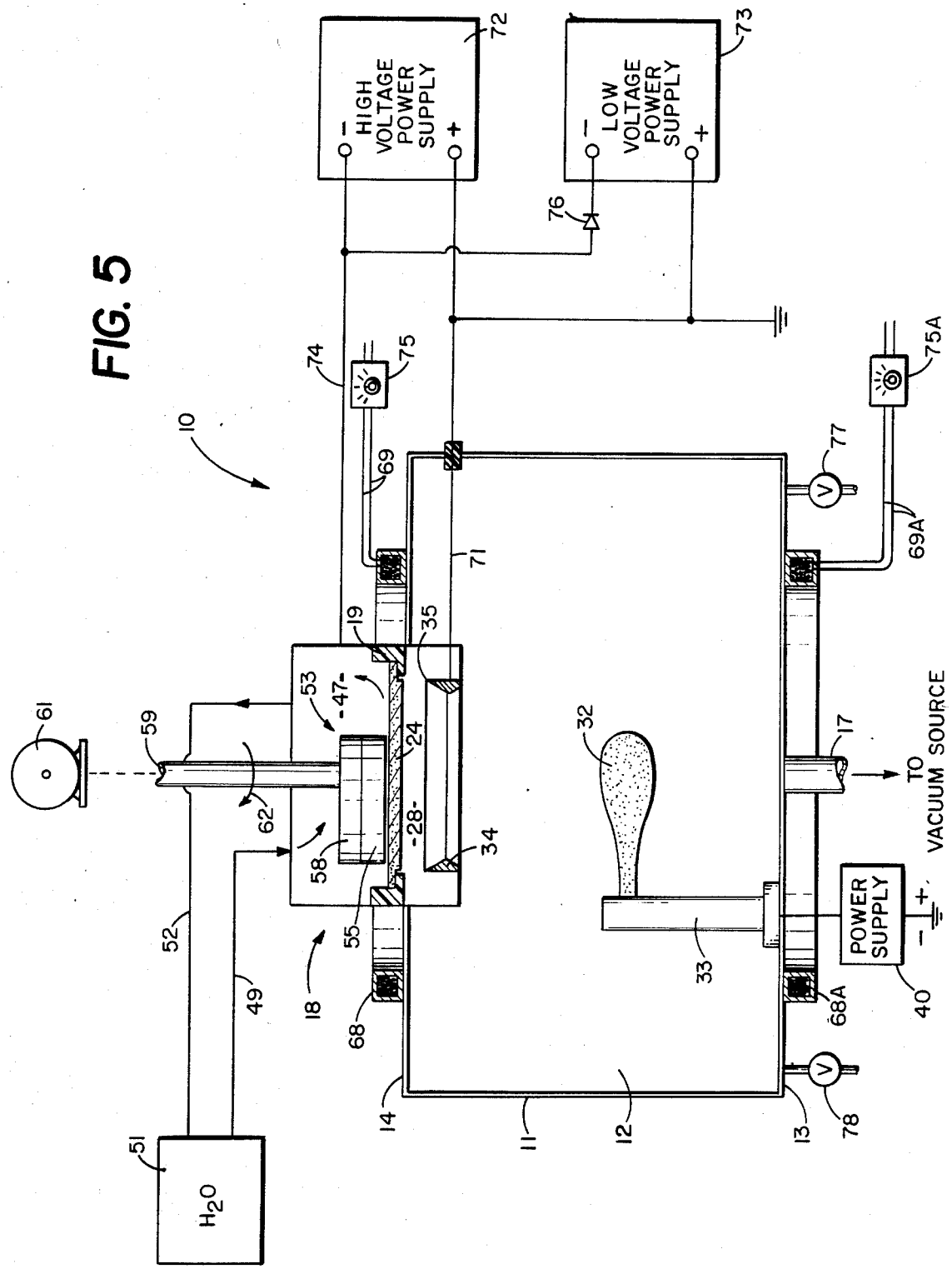
FIG. 5 is a schematic view showing the controlled vacuum arc deposition apparatus and cooling and power supplies therefor.

As shown in FIG. 5, anode 34 is connected with an electrical conductor 71 to ground, a high voltage power supply 72, and low voltage power supply 73. The negative terminal of power supplies 72 and 73 are connected to an electrical conductor 74 leading to cathode carrier 41 and thereby connecting cathode 24 to the negative potential of power supplies 72 and 73. A rectifier 76 in line 74 prevents high voltage from power supply 72 to flow to power supply 73.

Housing 11 has a valve 78 to allow the introduction of an inert gas, such as Argon, as well as other gases and gas mixtures, into vacuum chamber 12. A second valve 77 can be a leakage valve used to adjust or release the vacuum pressure in chamber 12.

In use, the cylindrical central magnet member 56 carried by the soft magnetic member 54 produces a circular symmetric closed fringing magnetic field. The geometry of anode 34 and cathode 24 is chosen so that the fringing magnetic field produced by the magnetic apparatus 53 is substantially normal to the electric field generated between cathode 24 and annular anode 34 when an appropriate electrical potential difference is applied to the anode and cathode. The magnetic apparatus 53 is used as an electron trap for electrons emitted from the active cathode surface 27 when a high voltage is applied to the cathode 24. A negative potential is applied to cathode 24. In the absence of a magnetic field in the vicinity of the cathode 24, a weak discharge is induced within the vacuum chamber. Inert gases, such as Argon and Krypton, are admitted into the chamber 12 via valve 78 to induce self-sustaining glow discharge. The discharge current is a function of gas species, chamber pressure, and applied voltage. When an electron trap is produced with an electric and magnetic field, a dense, ring-shaped plasma is produced close to the active surface 27 of the cathode 24.

Figure 4:
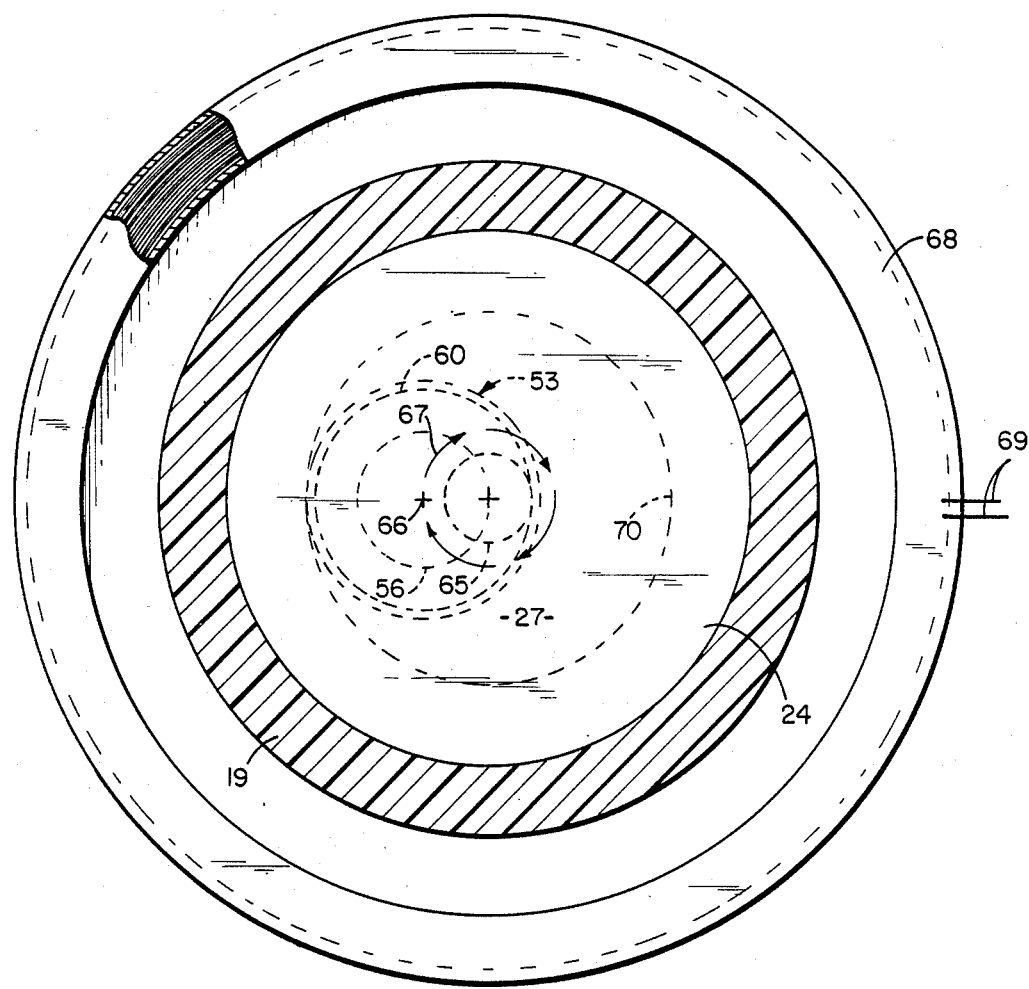
FIG. 4 is a sectional view taken along the line 4—4 of FIG. 3.
Figure 8:
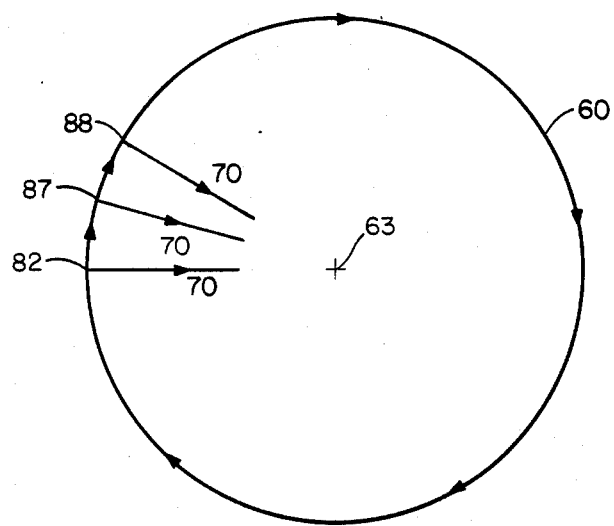
FIG. 8 is a diagram of a circular closed arc track achieved by the material deposition head.

The ring plasma generated by admitting Argon or other heavy inert gas into chamber 12 has sufficient conductivity to initiate a high current, low voltage arc discharge between the cathode 24 and anode 34. This is achieved by adjusting the vacuum pressure in the chamber to 0.1 to $500 \times 10^{-3}$ mm Hg or more through the admission of heavy inert gas, such as Argon, and applying a moderate negative potential of 100 to a few 1,000 volts DC from power supply 72 to the cathode 24 and anode 34. The simultaneous application of a high voltage, low current DC power supply 72 and a high current, low voltage DC power supply 76 to the cathode 24 and anode 34 generates a conductive plasma which in turn ignites the desired high current, low voltage discharge. As soon as the arc is ignited, the high voltage power supply 72 is disconnected. The arc produced is steered by the magnetic field of magnet apparatus 53 and coil 68 and sustains itself indefinitely. The arc track is determined by the shape of pole or member 56 and the annular ring configuration of member 54. In the embodiment of FIGS. 3 and 4, as illustrated in FIGS. 4 and 8, the arc track 60 is a circular band on active surface 27 of cathode 24. The inwardly directed vectors 70 represent magnetic fields parallel to the active surface 27.

Intense arc erosion occurring along the arc track 60 results in the formation of grooves on the active surface 27 of cathode 24. The erosion action is distributed more evenly over this surface by rotating the magnet apparatus 53 around axis 63. The rotaton of the magnet apparatus 53 causes the arc track 60 defined by the magnet apparatus 53 to trace a cycloidal path on the active surface 27 of cathode 24. The dimensions of pole 56 and cathode 24 may be chosen so as to cause the arc path and hence arc erosion of the cathode to be confined to a ring-shaped region between circles 65 and 70 in FIG. 4 of the active surface 27 of cathode 24. The inner radius 65 of this ring region can be made zero by the appropriate choice of magnetic axis 66 and the shape and dimensions of pole 56.

Figure 9:
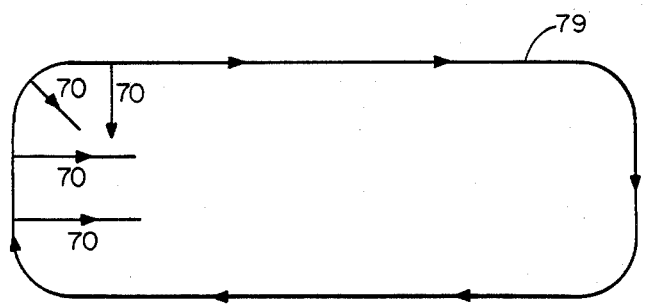
FIG. 9 is a diagram of a first modification of the closed arc track.
Figure 10:
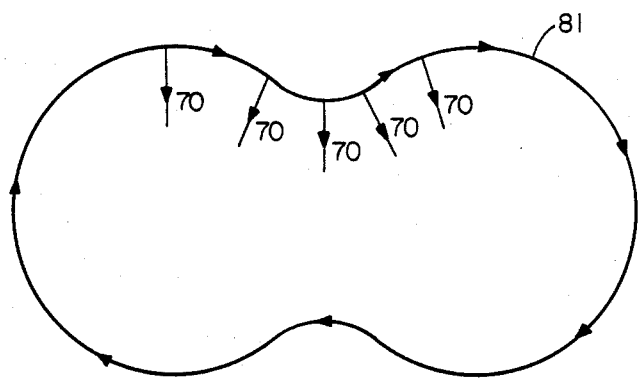
FIG. 10 is a diagram of a second modification of the closed arc track.

Circular arc track 60 in FIG. 8 and rectangular arc track 79 in FIG. 9, and connected circular arc track 81 in FIG. 10 are realized with appropriate variations in the geometry of pole 56. Other closed arc tracks, such as triangular and elliptical, can be used. The condition to be met to fulfill generation of a closed arc track, such as track 60, 79 and 81, is the pesence of a continuously turning magnetic field vectors 70 parallel to the active surface 27 of cathode 24, as shown in FIGS. 8, 9 and 10. It is only necessary that the field vectors be closed. Rectangle, triangle, ellipse, and other closed shapes for the arc track defined by magnet apparatus 53 are sufficient to accomplish arc track control. Magnet apparatus 53 may be provided with suitable movements, such as translative movement, to more evenly distribute arc erosion on the cathode surface where non-circular arc tracks are used.

With strict arc track control, arc induced cathodic erosion is confined to the arc track. Using a time varying magnetic field of appropriate magnitude generated with coil 68, or coils 68 and 68A, the arc track can also be made to sweep over major portions of the active surface 27 of the cathode 24 to insure uniform cathode erosion. This insures high cathode material utilization efficiency when magnet apparatus 53 is not rotated.

As shown in FIG. 5, object 32 is electrically connected to an independent power supply 40 operable to apply a positive or negative bias to the object. The bias is selected to optimize the adhesion or bond strength of the coating material covering the object. The power supply 40 can be a sputtering power supply used to clean the object. Object 32 can be connected to power supply 73 to serve as an anode for the primary or main arc.

Figure 6:
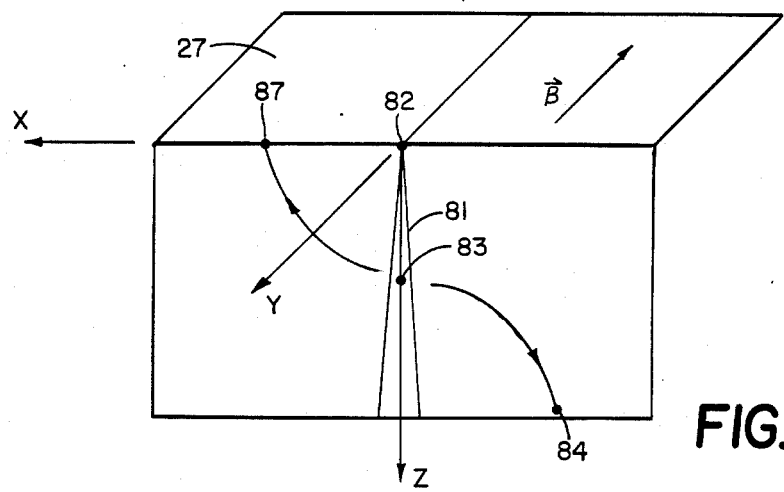
FIG. 6 is a diagram showing ion motion in a plane perpendicular to the magnetic field.

FIG. 6 is a diagram showing the ion motion in the vicinity of the arc column 81. The arc column 81 emanates from a spot indicated at 82 on the active surface 27 of the cathode. Vapors ejected from arc spot 82 are ionized as indicated at point 83. A portion of the ions 84 produced at 83 are ejected into the vacuum chamber 12. Other ions 85 move to the active surface 27 of the cathode and initiate a new arc spot at 87.

Figure 7:
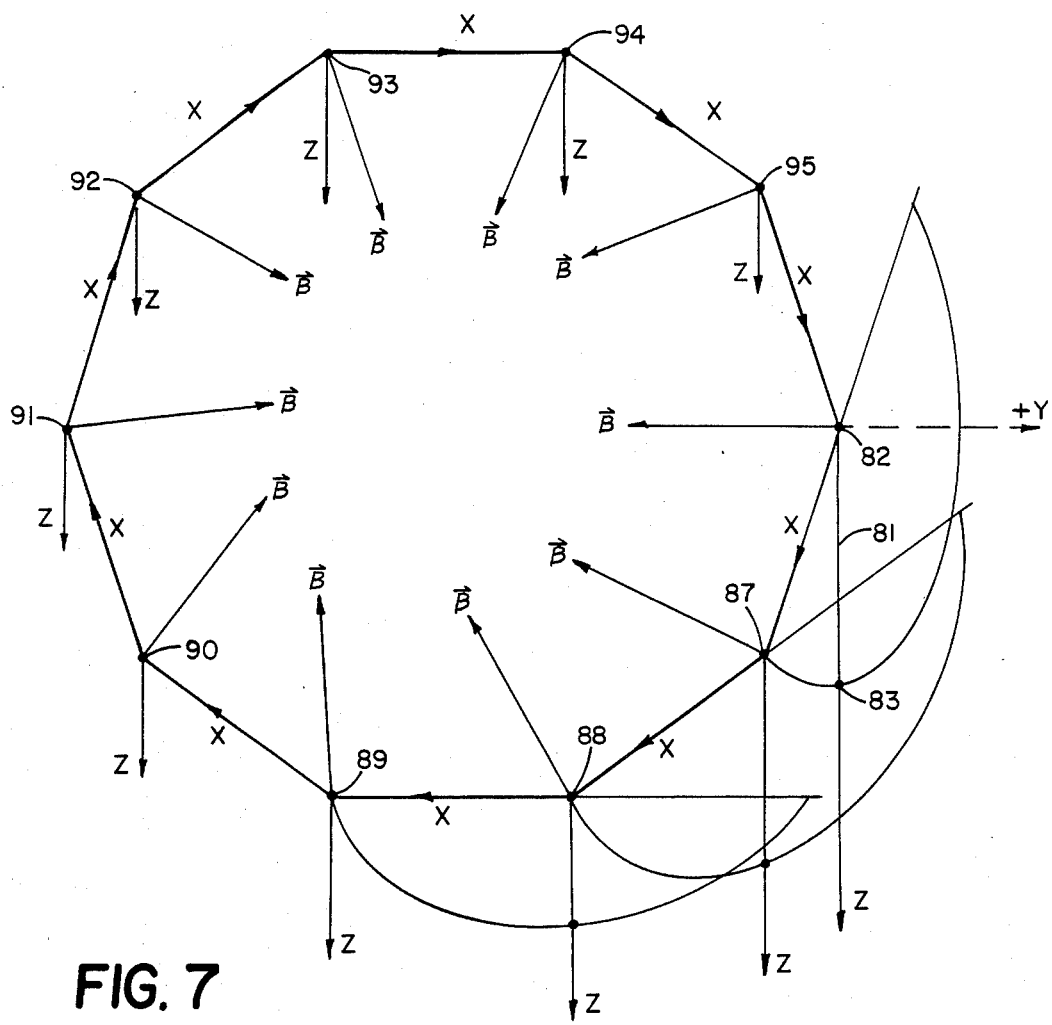
FIG. 7 is a diagram showing the order of arc spot sequence along the closed arc path on the active surface of the cathode.

FIG. 7 is a diagram showing the order of arc spot sequence along the closed arc path on the active surface of the cathode. The initial arc spot 82 is the start of the arc column 81 with ionization occurring at point 83. The arc spot sequence is illustrated by the reference numerals 87 to 95. The vectors X and Y represent the plane of the active surface 27 of the cathode 24. The Z vectors represent the arc columns emanating from the cathode spots 87-95.

Figure 11:
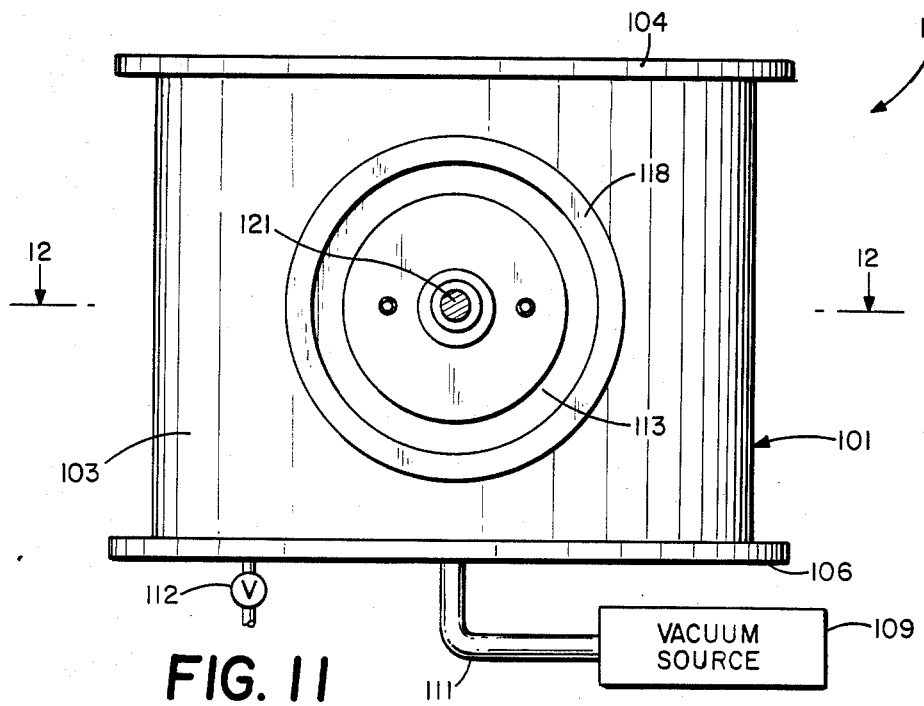
FIG. 11 is a side view of a modification of the controlled vacuum arc material deposition apparatus of the invention.
Figure 12:
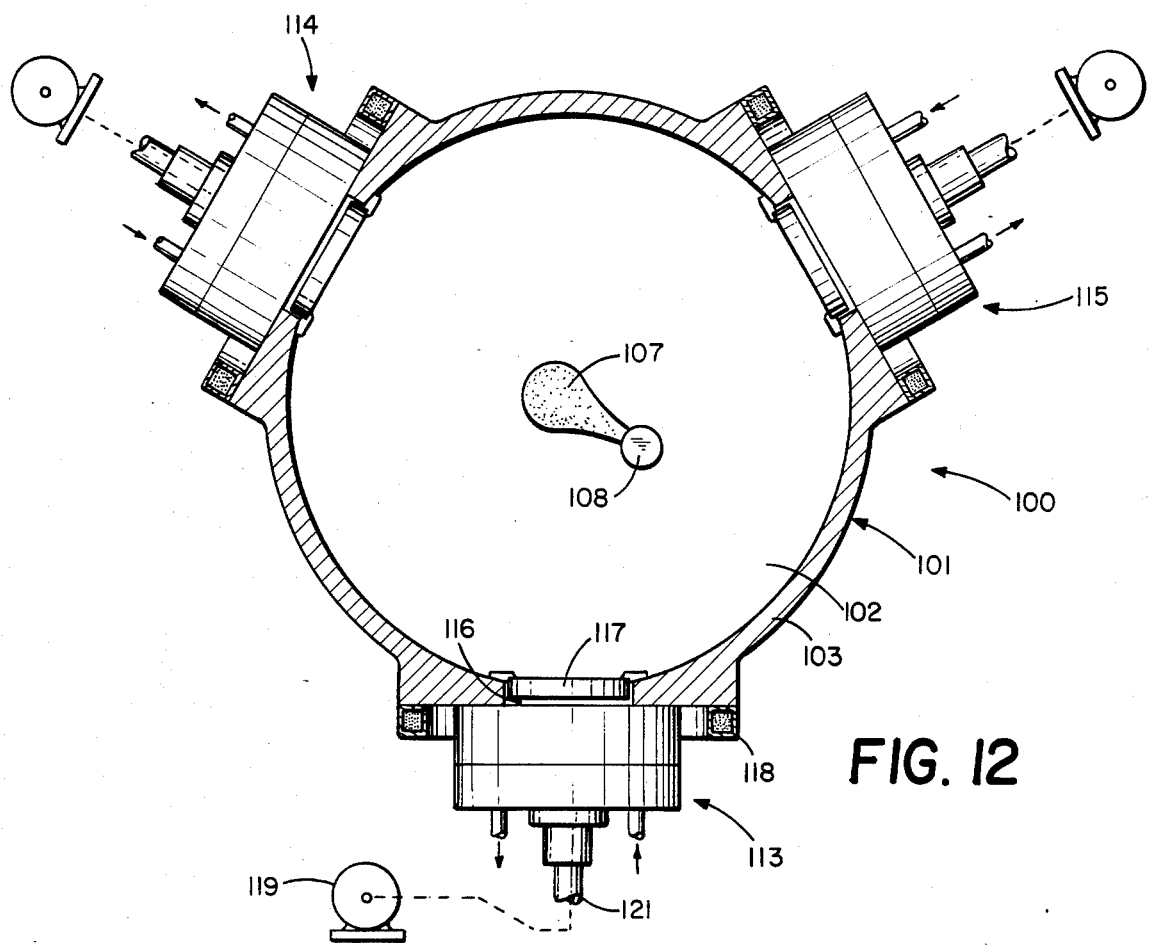
FIG. 12 is a sectional view taken along the line 12—12 of FIG. 11.

Referring to FIGS. 11 and 12, there is shown a modification of the controlled vacuum arc material deposition apparatus of the invention indicated generally at 100. Apparatus 100 is operable to apply a plurality of materials to an object or part located in the vacuum chamber. The apparatus has a housing indicated generally at 101 surrounding a vacuum chamber 102. The housing 101 has a cylindrical sleeve-like side wall 103 attached to a top wall 104 and a bottom wall 106. An object 107, such as a turbine blade, is centrally located in chamber 102 and supported on an insulator 108. A source of vacuum 109 is coupled with hose 111 to housing 101 to evacuate the chamber 102. A valve 112 mounted on bottom wall 106 is used to introduce an inert gas, such as Argon, or other gases and gas mixtures, to vacuum chamber 102.

Three material deposition heads 113, 114 and 115 are mounted on circumferentially spaced portions of side wall 103. Side wall 103 is provided with suitable openings for each of the material deposition heads. The number of material deposition heads can vary. As shown in FIG. 12, head 113 covers opening 116 accommodating anode 117. A solenoidal coil 118 surrounds head 113. An electric motor 119 drivably connected to a shaft 121 rotates the permanent magnet in the head 113.

The material deposition heads 113, 114 and 115 are identical in structure to head 18, as shown in FIGS. 3 and 5, and herein described. The description of the details of the head 18 and coil 68 are incorporated herein by reference. The cathodes of the heads 113, 114 and 115, can be of different materials so that the coating material that is deposited on the object 107 is a combination of the different materials of the cathodes. All of the material deposition heads 113, 114 and 115 can be simultaneously operated to produce the desired coating on object 107. Alternatively, one or more of the heads 113, 114 and 115, can be operated sequentially to produce layers of coating materials on the object 107. The operation of the head 113 and coil 118 to control the arc path of the arc column is the same as herein described with reference to FIGS. 1 to 10. Metal vapors produced with the vacuum arc may be reacted with suitable gases or gas mixtures admitted through valve 112 to deposit single or multi-layered metal, ceramic and semi-conductor coatings.

While there has been shown and described two embodiments of the controlled vacuum arc material deposition apparatus and method, it is understood that changes in size, structure, arrangement of structure, electrical circuits, and materials of the anode and cathode, may be made by those skilled in the art without departing from the invention. The invention is defined in the following claims.

We claim:

1. An apparatus for applying material by vacuum arc deposition to an object comprising: housing means having a vacuum chamber accommodating the object, means for maintaining a vacuum in said chamber, at least one material deposition head attached to the housing means, a cathode mounted on said head, said cathode having an active surface in said vacuum chamber, anode means located in said vacuum chamber, means for generating and sustaining an electric arc between the active surface and said anode means, the material of said active surface being vaporized by said electric arc and deposited on said object forming a coating thereon, magnet means forming opposite magnetic poles with both poles located adjacent said cathode and in registry therewith on a side of the cathode opposite from the active surface, one of said poles comprising a central magnet and the other pole comprising a peripheral wall surrounding the central magnet to establish a magnetic field having an outer periphery and extending inwardly toward the central magnet, the magnetic field passing through the cathode and having portions generally parallel to the cathode, the poles being spaced apart in direction along the active surface, to control and direct the path of movement of said arc along a defined closed arc track on the active surface of the cathode, and means movably mounting the magnet means on the head means operable to move the magnet means relative to the cathode whereby the defined arc track sweeps across at least portions of the active surface of the cathode.

2. The apparatus of claim 1 wherein: said means movably mounting the magnet means includes means for rotating the magnet means about an axis generally normal to said active surface and offset from the magnetic axis of the magnet means whereby the arc track sweeps the active surface of the cathode.

3. The apparatus of claim 2 wherein: said head has a cooling chamber, said cathode having a portion thereof located in the cooling chamber, said magnet means being located in said cooling chamber adjacent the portion of the cathode, and means for circulating cooling fluid through said cooling chamber.

4. The apparatus of claim 3 including: rotatable shaft means mounted on the head supporting the magnet means in said cooling chamber.

5. The apparatus of claim 2 including electromagnetic coil means located around said head selectively energizable to provide a secondary magnetic field to modify the strength of the magnetic field of the magnet means acting normal to said active surface of the cathode.

6. The apparatus of claim 1 including: coil means mounted on the housing means operable to selectively reinforce or reduce the magnetic field strength normal to the active surface of the cathode.

7. The apparatus of claim 1 wherein: the central magnet of the magnet means comprises a permanent magnet, the peripheral wall comprising a cup of soft magnetic material magnetically coupled to the permanent magnet surrounding said central magnet, the central magnet being spaced from the cathode a greater distance than the pole formed by the peripheral wall.

8. The apparatus of claim 1 wherein: said cathode is a member having a generally flat active surface, and said anode means is an annular member located adjacent said active surface, said annular member having a shape annular edge spaced from said active surface of the cathode.

9. The apparatus of claim 1 wherein: a plurality of material deposition heads are attached to the housing, each head having a cathode with an active surface in the vacuum chamber, anode means located in the vacuum chamber, means for generating an electric arc between the active surface and said anode means, the material of said active surface of the cathodes being vaporized by said electric arc and deposited on said object forming a coating thereon, magnet means located adjacent said cathode to establish a magnetic field causing said electric arc to move in a continuously controlled arc track relative to the active surface of the cathode, and means movably mounting the magnet means on each head, means operable to move the magnet means relative to the cathode whereby the arc track sweeps the active surface of each cathode.

10. The apparatus of claim 1 including: first means providing a high voltage supply connected to the cathode and anode means, second means providing a low voltage supply connected to the cathode and anode means, and rectifier means connected to the first means and second means to allow ignition of the electric arc between the anode and cathode on application of high voltage from the first means and to sustain the electric arc with the low voltage from the second means upon termination of the high voltage.

11. The apparatus of claim 1 wherein: the means for generating an electric arc includes power supply means providing a voltage, means for introducing a heavy inert gas into the vacuum chamber, said voltage, magnetic field and inert gas acting together to start the electric arc.

12. An apparatus for applying material by vacuum arc deposition to an object comprising: housing means having a vacuum chamber accommodating the object, means for maintaining a vacuum in said chamber, at least one material deposition head attached to the housing means, a cathode mounted on said head, said cathode having a central plane and an active surface in said vacuum chamber, anode means located in said vacuum chamber, means for generating an electric arc between the active surface of the cathode and said anode means, the material of said active surface of the cathode being vaporized by said electric arc and deposited on said object forming a coating thereon, first means positioned on a side of said cathode opposite the active surface for establishing a controlled magnetic field generally parallel to the active surface of the cathode to control and direct the path of movement of the electric arc along a closed arc track relative to the active surface of the cathode, said first means comprising a centrally located magnet means with a first pole adjacent the cathode, second means magnetically coupled to the centrally located magnet means defining a substantially continuous peripheral pole of opposite polarity from the first pole surrounding the centrally located magnet means and also being adjacent the cathode, and third means operable to move the first means relative to the cathode to cause the electric arc track to continuously sweep the active surface of the cathode.

13. The apparatus of claim 12 including: coil means located around the housing means operable to modify the magnetic field to provide additional control over the arc path.

14. The apparatus of claim 12 including: coil means operable to establish a magnetic field to provide additional control over the arc path.

15. The apparatus of claim 14 wherein: the coil means includes a pair of coils located adjacent opposite sides of the anode means.

16. An apparatus for applying material by vacuum arc deposition to an object with a cathode having an active surface and an anode located in a vacuum chamber, and means for generating an electric arc between the active surface of the cathode and anode, comprising: first means located adjacent said cathode to establish a controlled magnetic field between spaced magnetic poles of opposite polarity, both of which poles are adjacent a side of the cathode opposite the actual surface and with one pole comprising a peripheral wall encompassing the outer pole, to provide a magnetic field between the poles passing through the cathode and at first locations on the cathode active surface the magnetic field being generally parallel to the active surface of the cathode, said first locations defining a continuous closed path at the active surface of the cathode to control and direct the path of movement of said electric arc relative to the active surface of the cathode to travel along a closed arc track relative to the active surface of the cathode as defined by the peripheral wall pole and the first locations of the magnetic field, and second means movably mounting the first means for movement relative to the cathode whereby the magnetic field of the first means is moved across the cathode to cause the electric arc track to continuously sweep the active surface of the cathode.

17. The apparatus of claim 16 wherein: said second means includes means for rotating the magnet means about an axis generally normal to the active surface of the cathode and offset from the magnetic axis of the magnet means whereby the electric arc sweeps the active surface of the cathode.

18. The apparatus of claim 16 including: coil means located adjacent said first means operable to modify the magnetic field strength normal to said active surface of the cathode.

19. An arc control apparatus for use in controlling movement of an arc over the active surface of a generally planar cathode when such arc is established between an anode and the cathode, said control apparatus comprising a magnet support member, means for mounting the magnet support for movement relative to the cathode, and magnet means mounted on said magnet support member, said magnet means comprising a central magnet having a first surface forming a first magnetic pole adjacent the cathode, and an encompassing wall of soft magnetic material magnetically coupled to the opposite pole of the first magnet, said encompassing wall having a peripheral edge surface lying generally along a plane which is spaced from the cathode a shorter distance than the spacing of the first surface of the central magnet, to establish a magnetic field from the peripheral wall edge surface to the central magnet with at least portions of said field passing through said cathode to define a closed arc track on the active surface of the cathode.

20. A method of vacuum arc deposition of material on an object with an active surface of a cathode and an anode comprising: establishing a vacuum in a chamber accommodating an anode and an active surface of a cathode, applying opposite electrical potential to said anode and cathode to establish and maintain an electric arc between said anode and cathode, controlling and directing the path of movement of the electric arc along a defined closed electric arc track, by establishing a magnetic field between first means forming a first central magnetic pole and second means defining a secnd peripheral magnetic pole spaced from and surrounding the central magnetic pole and of opposite polarity therefrom, positioning the first and second means adjacent the cathode and on an opposite side of the cathode from the active surface of the cathode so the magnetic field adjacent the peripheral pole extends generally parallel to the active surface of the cathode, and sweeping the active surface of the cathode with the electric arc track by moving the magnetic field relative to the cathode.

21. The method of claim 20 including: modifying the magnet field with a solenoid generated magnetic field to control the electric arc track.

22. The method of claim 20 including: superpositioning a solenoid generated magnetic field on the magnetic field to reduce the normal component of the magnetic field.

23. The method of claim 20 wherein: the track of the electric arc is controlled by controlling a magnet field with a solenoid coil.

24. The method of claim 20 wherein: the electric arc is established by introducing an inert gas into the vacuum chamber, applying a high voltage to establish an electric arc, said inert gas, high voltage, and magnetic field acting together to start the electric arc, applying a low voltage to maintain the electric arc, and terminating the high voltage.

25. The method of claim 20 wherein: the electric arc is established by supplying a heavy inert gas to the vacuum chamber, maintaining the vacuum chamber at a selected vacuum pressure, and applying a first high voltage power supply to establish an electric arc, said first high voltage, inert gas, and magnetic field acting together to start the electric arc.

* * * * *

UNITED STATES PATENT AND TRADEMARK OFFICE
CERTIFICATE OF CORRECTION

PATENT NO. : 4,673,477

DATED : June 16, 1987

INVENTOR(S) : Subbiah Ramalingam et al.

It is certified that error appears in the above-identified patent and that said Letters Patent is hereby corrected as shown below:

Column 10, line 18, after "including", insert --:--.

Column 11, line 50, delete "outer" and insert --other--.

Column 12, line 35, delete "secnd" and insert --second--.

Signed and Sealed this

Twentieth Day of October, 1987

Attest:

DONALD J. QUIGG

Attesting Officer

Commissioner of Patents and Trademarks

REEXAMINATION CERTIFICATE (1897th)
United States Patent [19]
Ramalingam et al.

[11] B1 4,673,477
[45] Certificate Issued Jan. 12, 1993

[54] CONTROLLED VACUUM ARC MATERIAL DEPOSITION, METHOD AND APPARATUS

[75] Inventors: Subbiah Ramalingam, Roseville, Minn.; Cai B. Qi, Beijing, China; Kyunghoon Kim, St. Paul, Minn.

[73] Assignee: Regents of the University of Minnesota, Minneapolis, Minn.

Reexamination Request:
No. 90/002,285, Feb. 19, 1991

Reexamination Certificate for:
Patent No.: 4,673,477
Issued: Jun. 16, 1987
Appl. No.: 825,958
Filed: Feb. 4, 1986

Certificate of Correction issued Oct. 20, 1987.

Related U.S. Application Data

[63] Continuation of Ser. No. 585,845, Mar. 2, 1984, abandoned.

[51] Int. Cl.⁵ .............................................. C23C 14/22
[52] U.S. Cl. ........................... 204/192.38; 118/50.1; 118/723; 204/298.41; 427/37; 427/47
[58] Field of Search ............. 204/192.38, 298.41; 427/37, 47; 118/50.1, 723, 728

[56] References Cited

U.S. PATENT DOCUMENTS

| | | | |
|---|---|---|---|
| 3,625,848 | 12/1971 | Snapper | 204/192.38 |
| 3,793,179 | 2/1974 | Sablev et al. | 204/298 |
| 3,956,093 | 5/1976 | McLeod | 204/192 |
| 4,444,643 | 4/1984 | Garrett | 204/298 |

FOREIGN PATENT DOCUMENTS

2707144  8/1977  Fed. Rep. of Germany .
1263830  2/1972  United Kingdom .

OTHER PUBLICATIONS

N. E. Bauman: "Vacuum Erosion type Generators and Plasma Accelerators working on Alternating Current"; 1981, Plenum Publishing Corporation.
John L. Vossen et al, *Thin Film Processes*, Academic Press, New York, 1978, pp. 76–83.
N. E. Bauman, Vacuum Erosion-Type Generators and Plasma Accelerators . . . , *Teplofizika Vysokikh Temperatur*, vol. 18, No. 5, Sep.–Oct., 1980.

*Primary Examiner*—John F. Niebling

[57] ABSTRACT

A method and apparatus for vacuum arc deposition of material on a surface of an object uses a vacuum chamber accommodating the active surface of the cathode and an anode. A power supply connected to the anode and cathode establishes an electric arc. The track of the arc is controlled with a magnetic field established with a permanent magnet that is moved in a closed path relative to the cathode. A solenoid modifies the main magnetic field produced on the active surface of the cathode.

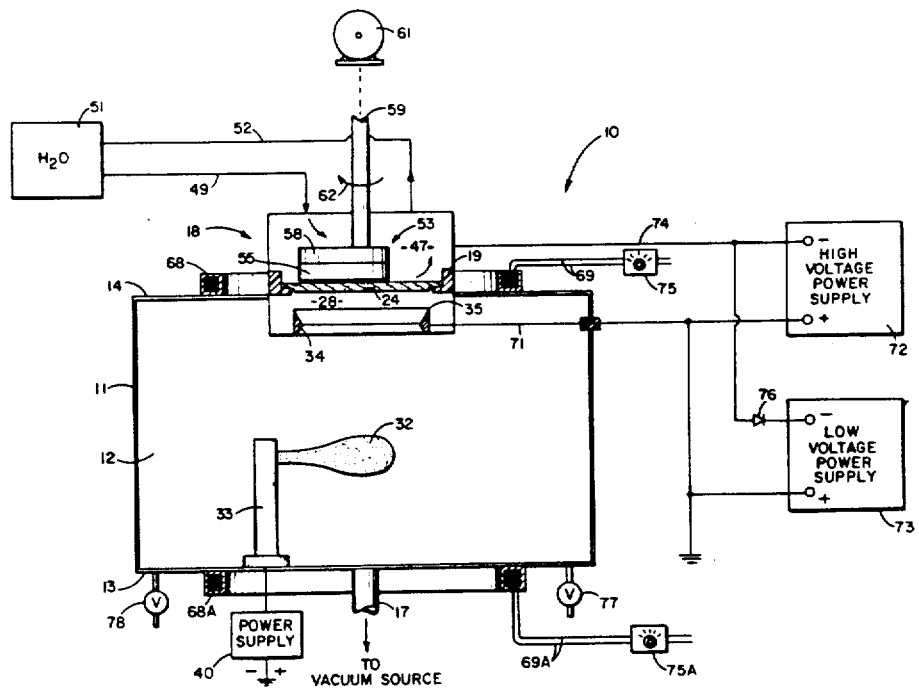

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2, 7, 12-18 and 20-25 are cancelled.

Claims 1, 3, 5, 8, 9 and 19 are determined to be patentable as amended.

Claims 4, 6, 10 and 11, dependent on an amended claim, are determined to be patentable.

New claims 26 and 27 are added and determined to be patentable.

1. An apparatus for applying material by vacuum arc deposition to an object comprising: housing means having a vacuum chamber accommodating the object, means for maintaining a vacuum in said chamber, at least one material deposition head attached to the housing means, a cathode mounted on said head, said cathode having an active *generally planar* surface in said vacuum chamber, anode means located in said vacuum chamber, means for generating and sustaining an electric arc between the active surface and said anode means, the material of said active surface being vaporized by said electric arc and deposited on said object forming a coating thereon, magnet means forming opposite magnetic poles with both poles located adjacent said cathode and in registry therewith on a side of the cathode opposite from the active surface, one of said poles comprising a *permanent* central magnet *having a central axis* and the other pole comprising a *cup of soft magnetic material magnetically coupled to the central permanent magnet and having a* wall surrounding the central magnet to establish a magnetic field having an outer periphery and extending inwardly toward the central magnet, the magnetic field passing through the cathode and having portions generally parallel to the cathode, the poles being spaced apart in direction along the active surface, *and the central magnet being spaced from the cathode a greater distance than the pole formed by the peripheral wall* to control and direct the path of movement of said arc along a defined closed arc track circumscribing a portion of the cathode and which is defined by the magnetic poles, on the active surface of the cathode, *the means for generating and sustaining, and the magnet means being of selected strength to sustain the arc in a sequence around the closed arc track,* and means movably mounting the magnet means on the head means operable to move the magnet means relative to the cathode whereby the defined arc track sweeps across at least portions of the active surface of the cathode.

3. The apparatus of claim [2] *1* wherein: said head has a cooling chamber, said cathode having a portion thereof located in the cooling chamber, said magnet means being located in said cooling chamber adjacent the portion of the cathode, and means for circulating cooling fluid through said cooling chamber.

5. The apparatus of claim [2] *3* including electromagnetic coil means located around said head selectively energizable to provide a secondary magnetic field to modify the strength of the magnetic field of the magnet means acting normal to said active surface of the cathode.

8. The apparatus of claim 1 wherein: [said cathode is a member having a generally flat active surface, and] said anode means is an annular member located adjacent said active surface, said annular member having a [shape] *sharp* annular edge spaced from said active surface of the cathode.

9. The apparatus of claim 1 wherein: a plurality of material deposition heads are attached to the housing, each head having a cathode with an active surface in the vacuum chamber, anode means located in the vacuum chamber, means for generating an electricarc between the active surface and said anode means, the material of said active surface of the cathodes being vaporized by said electric arc and deposited on said object forming a coating thereon, magnet means located adjacent said cathode to establish a magnetic field causing said electric arc to move in a continuously controlled arc track relative to the active surface of the cathode, and means movably mounting the magnet means on each head, *including* means operable to move the magnet means relative to the cathode whereby the arc track sweeps the active surface of each cathode.

19. An arc control apparatus for use in controlling movement of an arc over the active surface of a generally planar cathode when such arc is established *and sustained* between an anode and the cathode, said control apparatus comprising a magnet support member, means for mounting the magnet support for movement relative to the cathode, and magnet means mounted on said magnet support member, said magnet means comprising a central magnet having a first surface forming a first magnetic pole adjacent the cathode, and an encompassing wall of soft magnetic material magnetically coupled to the opposite pole of the first magnet, said encompassing wall having a peripheral edge surface lying generally along a plane which is spaced from the cathode a shorter distance than the spacing of the first surface of the central magnet, to establish a magnetic field from the peripheral wall edge surface to the central magnet with at least portions of said field passing through said cathode *at the active surface generally parallel to the active surface* to define a closed arc track on the active surface of the cathode, *the field being effective to cause a sustained arc to sequentially move in the closed arc track.*

*26. The arc control apparatus for claim.19 wherein said means for mounting the magnet support for movement relative to the cathode comprises means for rotating the magnet means about an axis generally normal to the active surface of the cathode and offset from the central magnet of the magnet means, whereby the electric arc sweeps the active surface of the cathode as it moves along the arc track.*

*27. The apparatus of claim 19 further including coil means operable to modify the magnetic field strength normal to said active surface of the cathode.*

* * * * *